(12) United States Patent
Jeon et al.

(10) Patent No.: US 11,665,937 B2
(45) Date of Patent: May 30, 2023

(54) DISPLAY PANEL WITH BYPASS LINE CONNECTED TO METAL LAYER ADJACENT TO TRANSMISSION AREA

(71) Applicant: Samsung Display Co., Ltd., Yongin-si (KR)

(72) Inventors: Yujin Jeon, Yongin-si (KR); Wonse Lee, Yongin-si (KR); Sukyoung Kim, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 344 days.

(21) Appl. No.: 17/004,739

(22) Filed: Aug. 27, 2020

(65) Prior Publication Data

US 2021/0083038 A1    Mar. 18, 2021

(30) Foreign Application Priority Data

Sep. 16, 2019  (KR) .......................... 10-2019-0113521

(51) Int. Cl.
*H01L 27/32* (2006.01)
*G06F 3/041* (2006.01)
*H01L 51/52* (2006.01)

(52) U.S. Cl.
CPC .......... *H01L 27/3276* (2013.01); *G06F 3/041* (2013.01); *H01L 27/3265* (2013.01); *H01L 51/5246* (2013.01); *H01L 27/323* (2013.01); *H01L 27/3258* (2013.01)

(58) Field of Classification Search
CPC ............. H01L 27/3276; H01L 27/3265; H01L 27/323; H01L 27/3258; H01L 51/5246; G06F 3/041
See application file for complete search history.

(56) References Cited

U.S. PATENT DOCUMENTS

| 8,237,906 | B2 | 8/2012 | Igeta et al. |
| 8,890,181 | B2 | 11/2014 | Wang et al. |
| 9,502,683 | B2 | 11/2016 | Hong et al. |

(Continued)

FOREIGN PATENT DOCUMENTS

| JP | 2010-66461 A | 3/2010 |
| JP | 5955298 B2 | 7/2016 |

(Continued)

*Primary Examiner* — Lex H Malsawma
(74) *Attorney, Agent, or Firm* — Lewis Roca Rothgerber Christie LLP

(57) ABSTRACT

A display panel includes: a first substrate including a transmission area, a display area arranged to at least partially surround the transmission area, and a first non-display area arranged between the transmission area and the display area; display elements arranged in the display area; a first bypass line arranged in the first non-display area and arranged to bypass the transmission area; a second substrate arranged to face the first substrate; a sealing member joining the first substrate to the second substrate and surrounding the periphery of the transmission area; and a metal layer arranged in the first non-display area and arranged more adjacent to the transmission area than the first bypass line, wherein the metal layer is arranged in a different layer than the first bypass line and is electrically connected to the first bypass line.

20 Claims, 12 Drawing Sheets

(56) References Cited

U.S. PATENT DOCUMENTS

| | | |
|---|---|---|
| 10,049,618 B2 | 8/2018 | Jeong |
| 2020/0044006 A1* | 2/2020 | Lee ..................... H01L 27/3276 |
| 2020/0176542 A1* | 6/2020 | Park ..................... G09G 3/3241 |
| 2020/0357878 A1* | 11/2020 | Jo ....................... H01L 27/3262 |

FOREIGN PATENT DOCUMENTS

| | | |
|---|---|---|
| KR | 10-2005-0029019 A | 3/2005 |
| KR | 10-2016-0000553 A | 1/2016 |
| KR | 10-2016-0119909 A | 10/2016 |

\* cited by examiner

DISPLAY PANEL WITH BYPASS LINE CONNECTED TO METAL LAYER ADJACENT TO TRANSMISSION AREA

CROSS-REFERENCE TO RELATED APPLICATION

This application claims priority to and the benefit of Korean Patent Application No. 10-2019-0113521, filed on Sep. 16, 2019, in the Korean Intellectual Property Office, the entire content of which is incorporated herein by reference.

BACKGROUND

1. Field

One or more embodiments relate to display panels.

2. Description of Related Art

Recently, display apparatuses have been used for various purposes. Also, as display apparatuses have become thinner and lighter, their range of use has widened.

Because display apparatuses are being used in various ways, various methods may be utilized to design the shapes of display apparatuses, and further, more and more functions may be combined and/or associated with display apparatuses.

SUMMARY

One or more aspects of embodiments of the present disclosure are directed toward a display panel including a transmission area in which cameras, sensors, and/or the like may be arranged inside a display area, as a method of increasing functions that may be combined and/or associated with display apparatuses.

However, the scope of the present disclosure is not limited thereto.

Additional aspects will be set forth in part in the description which follows and, in part, will be apparent from the description, or may be learned by practice of the presented embodiments of the disclosure.

According to one or more embodiments, a display panel includes a first substrate including a transmission area, a display area at least partially surrounding the transmission area, and a first non-display area between the transmission area and the display area, display elements in the display area, a first bypass line in the first non-display area, to detour the transmission area, a second substrate facing the first substrate, a sealing member joining the first substrate to the second substrate and surrounding the periphery of the transmission area, and a metal layer in the first non-display area and being more adjacent to the transmission area than the first bypass line, wherein the metal layer is in a different layer than the first bypass line and is electrically connected to the first bypass line.

In an embodiment, the display panel may further include a second bypass line in the first non-display area and to detour the transmission area, wherein the second bypass line may be arranged in a same layer as the metal layer.

In an embodiment, the first bypass line and the second bypass line may intersect or cross each other.

In an embodiment, the first bypass line may include a connection portion protruding toward a center of the transmission area, and the metal layer may be connected to the connection portion through a contact hole.

In an embodiment, the connection portion may be a plurality of connection portions.

In an embodiment, the first bypass line may be a portion of an electrode voltage line to provide a driving voltage to the display area.

In an embodiment, the first bypass line may extend from one electrode of a storage capacitor in the display area.

In an embodiment, the metal layer and the sealing member may surround the transmission area in a ring shape, and an inner diameter of the sealing member may be smaller than an inner diameter of the metal layer.

In an embodiment, the metal layer and the sealing member may surround the transmission area in a ring shape, and an outer diameter of the sealing member may be equal to an outer diameter of the metal layer.

In an embodiment, the display panel may further include a touchscreen layer over the second substrate, wherein the touchscreen layer may include a hole corresponding to the transmission area.

According to one or more embodiments, a display panel includes a first substrate including a first through hole, display elements on the first substrate and at least partially surrounding the first through hole, a first bypass line bent and extending along an edge of the first through hole, a second substrate facing the first substrate, a first sealing member joining the first substrate to the second substrate and surrounding a periphery of the first through hole, and a metal layer under the first sealing member and to surround the first through hole, wherein the metal layer is in a different layer than the first bypass line and is electrically connected to the first bypass line.

In an embodiment, a storage capacitor including a first storage capacitor plate and a second storage capacitor plate over the first storage capacitor plate may be arranged over the first substrate, and the first bypass line may be in a same layer as the second storage capacitor plate.

In an embodiment, the second storage capacitor plate may be connected to a driving voltage line through a contact hole, and the metal layer may be in a same layer as the driving voltage line.

In an embodiment, a first driving voltage line and a second driving voltage line spaced apart from each other with the first through hole therebetween may be arranged over the first substrate.

In an embodiment, a width of the first sealing member may be greater than a width of the metal layer.

In an embodiment, the display panel may further include a second sealing member joining the first substrate to the second substrate and surrounding an edge of the first substrate, wherein a width of the second sealing member may be greater than a width of the first sealing member.

In an embodiment, the second substrate may include a second through hole corresponding to the first through hole.

In an embodiment, the first bypass line may include a connection portion protruding toward the center of the transmission area, and the metal layer may be connected to the connection portion through a contact hole.

In an embodiment, the connection portion may be a plurality of connection portions.

In an embodiment, the metal layer may include a plurality of through holes.

BRIEF DESCRIPTION OF THE DRAWINGS

The above and other aspects, features, and advantages of certain embodiments of the disclosure will become more apparent from the following description taken in conjunction with the accompanying drawings, in which.

DETAILED DESCRIPTION

Figure 1A:
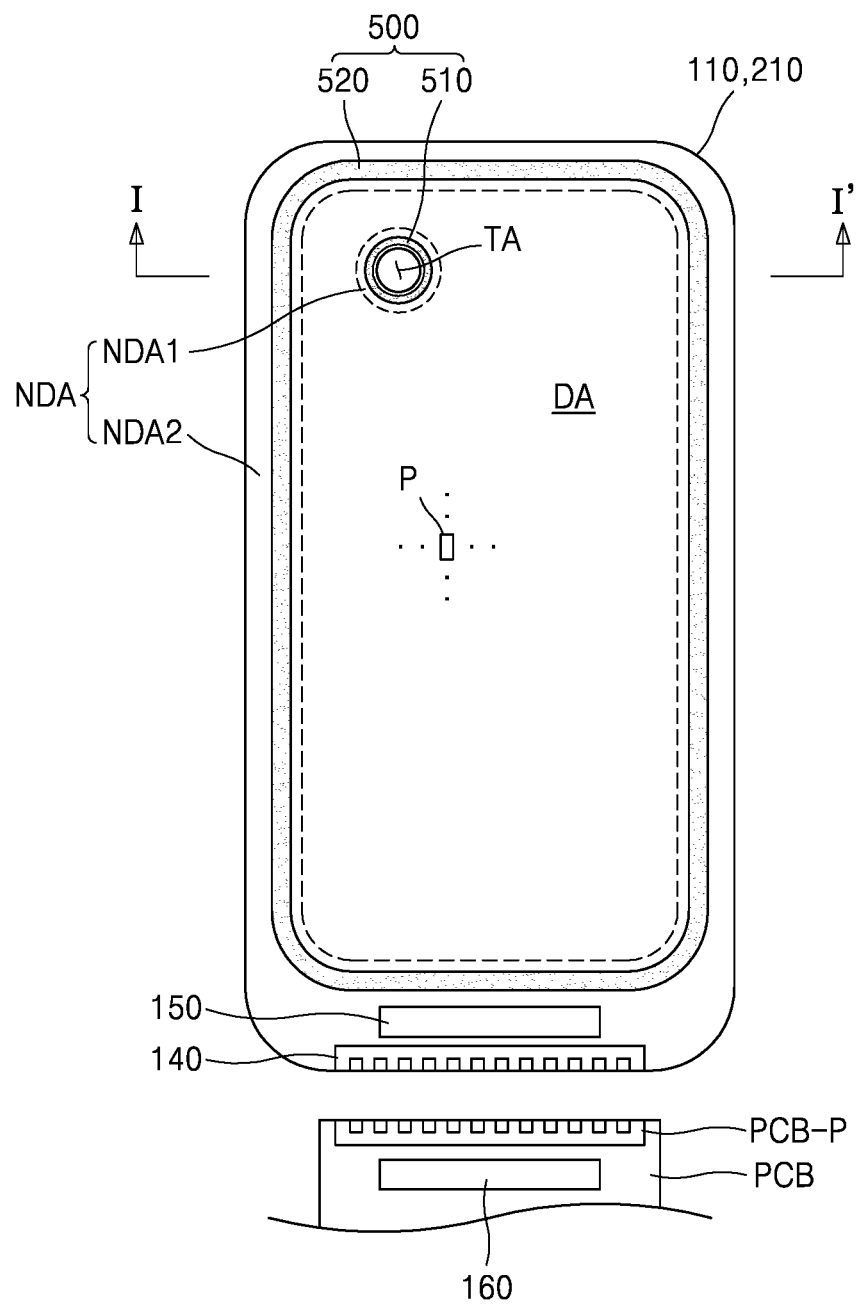
FIG. 1A is a schematic plan view of a display panel according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, embodiments of the present disclosure will be described in more detail with reference to the accompanying drawings, and in the following description, like reference numerals will denote like elements, and redundant descriptions thereof will not be provided.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component (without any intervening layers, regions, or components therebetween) or may be "indirectly on" the other layer, region, or component with one or more intervening layers, regions, or components therebetween.

Sizes of components in the drawings may be exaggerated for convenience of description. In other words, because the sizes and thicknesses of components in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being "connected to" another layer, region, or component, it may be "directly connected to" the other layer, region, or component (without any intervening layers, regions, or components therebetween) or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component (without any intervening layers, regions, or components therebetween) or may be "indirectly electrically connected to" the other layer, region, or component with one or more intervening layers, regions, or components therebetween.

Figure 1B:
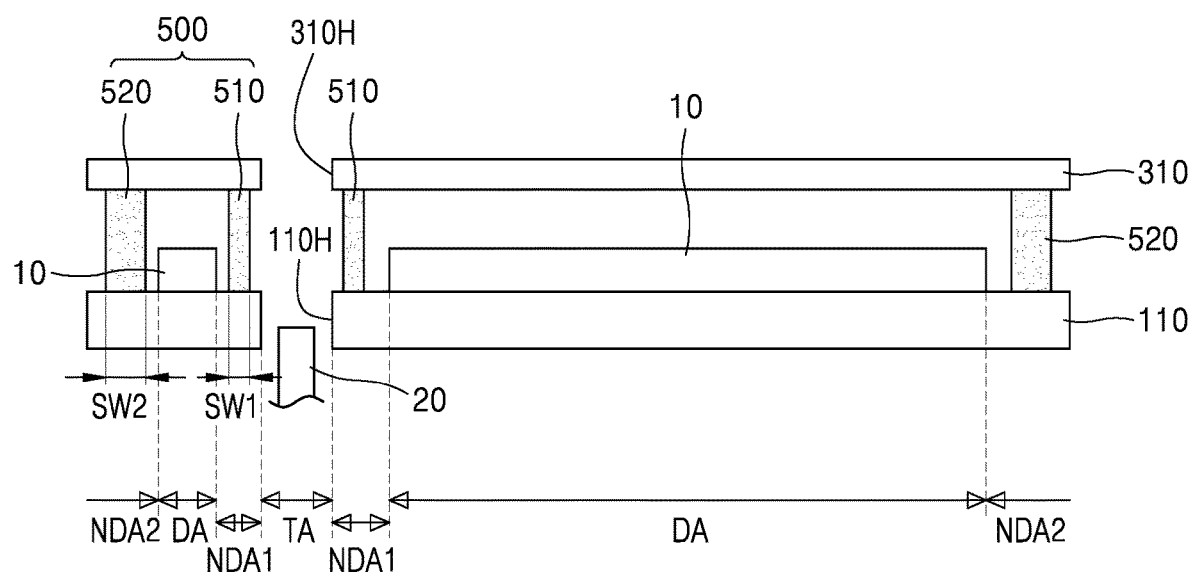
FIG. 1B is a schematic cross-sectional view of the display panel taken along line I-I' of FIG. 1A.

FIG. 1A is a schematic plan view of a display panel according to an embodiment, and FIG. 1B is a schematic cross-sectional view of the display panel taken along a line I-I' of FIG. 1A.

Referring to FIGS. 1A and 1B, the display panel may include a first substrate 110 where a display portion 10 is arranged, and a second substrate 310 arranged to face the first substrate 110. The first substrate 110 and the second substrate 310 may be sealed by a sealing member 500.

The first substrate 110 and the second substrate 310 may include various suitable materials such as glass materials, ceramic materials, plastic materials, and/or metal materials having $SiO_2$ as a main component.

The first substrate 110 may include a display area DA and a transmission area TA at least partially surrounded by the display area DA. Also, the first substrate 110 may include a first non-display area NDA1 arranged between the display area DA and the transmission area TA, and a second non-display area NDA2 outside the display area DA.

The display portion 10, including pixels P including one or more display elements such as organic light-emitting diodes (OLEDs), may be arranged in the display area DA of the first substrate 110. The pixels P may include a plurality of pixels P, and the plurality of pixels P may be arranged in various suitable forms such as stripe arrangement, pentile arrangement, and/or mosaic arrangement to implement an image. Each pixel P may emit, for example, red, green, blue, or white light through the display element. The pixel P may be understood as a subpixel emitting light of any one color selected from red, green, blue, and white.

The transmission area TA may be a position where an electronic element 20 is arranged. The transmission area TA may be an area through which light and/or sound output from the electronic element 20 to the outside, and/or propagating from the outside toward the electronic element 20, may be transmitted. Although one transmission area TA is illustrated in FIG. 1A, a plurality of transmission areas TA may be provided. Also, the shape, size, and position of the transmission area TA may be variously suitably modified.

The transmission area TA may be at least partially surrounded by the display area DA. In some embodiments, as illustrated in FIG. 1A, the transmission area TA may be entirely surrounded by the display area DA including the display elements. In other embodiments, the transmission area TA may be arranged between the display area DA and the second non-display area NDA2, and in this case, the transmission area TA may be partially surrounded by the display elements.

In the present embodiment, the first substrate 110 may include a first through hole 110H corresponding to the transmission area TA. Also, the second substrate 310 may include a second through hole 310H corresponding to the first through hole 110H of the first substrate 110.

The first non-display area NDA1 may be arranged between the transmission area TA and the display area DA. The first non-display area NDA1 may be arranged to surround the transmission area TA. In the first non-display area NDA1, pixels for implementing an image may not be arranged, and lines may be arranged to transmit electrical signals to pixels spaced apart from each other with the transmission area TA therebetween.

The second non-display area NDA2 may be arranged to extend along the edge of the display panel to surround the display area DA. In the second non-display area NDA2, pixels for implementing an image may not be arranged, and various lines, an internal circuit portion, a driving circuit portion 150, and/or the like may be arranged.

In some embodiments, a terminal portion 140 may be arranged at one side of the second non-display area NDA2. The terminal portion 140 may be exposed, without being covered by an insulating layer, to be electrically connected to a printed circuit board PCB. A terminal PCB-P of the printed circuit board PCB may be electrically connected to the terminal portion 140 of the display panel. The printed circuit board PCB may be configured to transmit power or signals of a controller 160 to the display panel.

The pixels P arranged in the display area DA may be connected to the internal circuit portion, the driving circuit portion 150, and the lines arranged in the second non-display area NDA2, to receive a driving voltage and an electrical signal.

The sealing member 500 may include a first sealing member 510 and a second sealing member 520. The sealing member 500 may bond the first substrate 110 and the second substrate 310 to each other to prevent or reduce oxygen, moisture, and/or the like from flowing into the display portion 10, and to improve a mechanical strength thereof.

The first sealing member 510 may be arranged in the first non-display area NDA1 to surround the transmission area TA. The second sealing member 520 may be arranged in the second non-display area NDA2 and may be continuously arranged along the edge of the display area DA. In some embodiments, in order to reduce the area of the first non-display area NDA1, a width SW1 of the first sealing member 510 may be smaller than a width SW2 of the second sealing member 520.

The first sealing member 510 and the second sealing member 520 may each independently include an inorganic material and may include, for example, a frit. The first sealing member 510 and the second sealing member 520 may be applied and formed by a dispenser and/or a screen printing method. A frit may sometimes refer to a powder-form glass raw material, however, in the present disclosure, the frit may also refer to a paste form in which a laser or infrared absorber, an organic binder, a filler for reducing a thermal expansion coefficient, and/or the like are included in a main material such as $SiO_2$. The paste-form frit may be cured by removing the organic binder and moisture through a drying or firing process. The laser or infrared absorber may include a transition metal compound. Laser light may be used as a heat source for curing the first sealing member 510 and the second sealing member 520 to bond the first substrate 110 and the second substrate 310 together.

Hereinafter, a display panel including an organic light-emitting diode as a display element will be described for convenience. However, embodiments of the present disclosure may also be applied to various suitable types (or kinds) of display panels such as inorganic EL display panels, quantum dot display panels, and/or liquid crystal display panels and display apparatuses including the same.

Figure 2A:
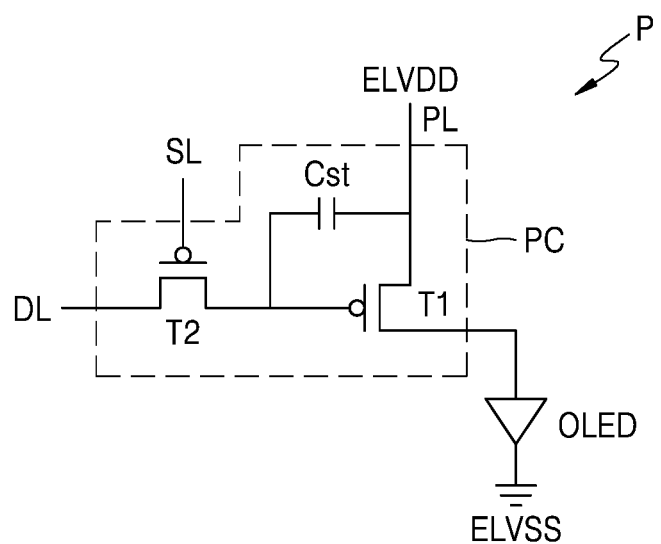
FIGS. 2A and 2B are equivalent circuit diagrams of pixels according to one or more embodiments.
Figure 2B:
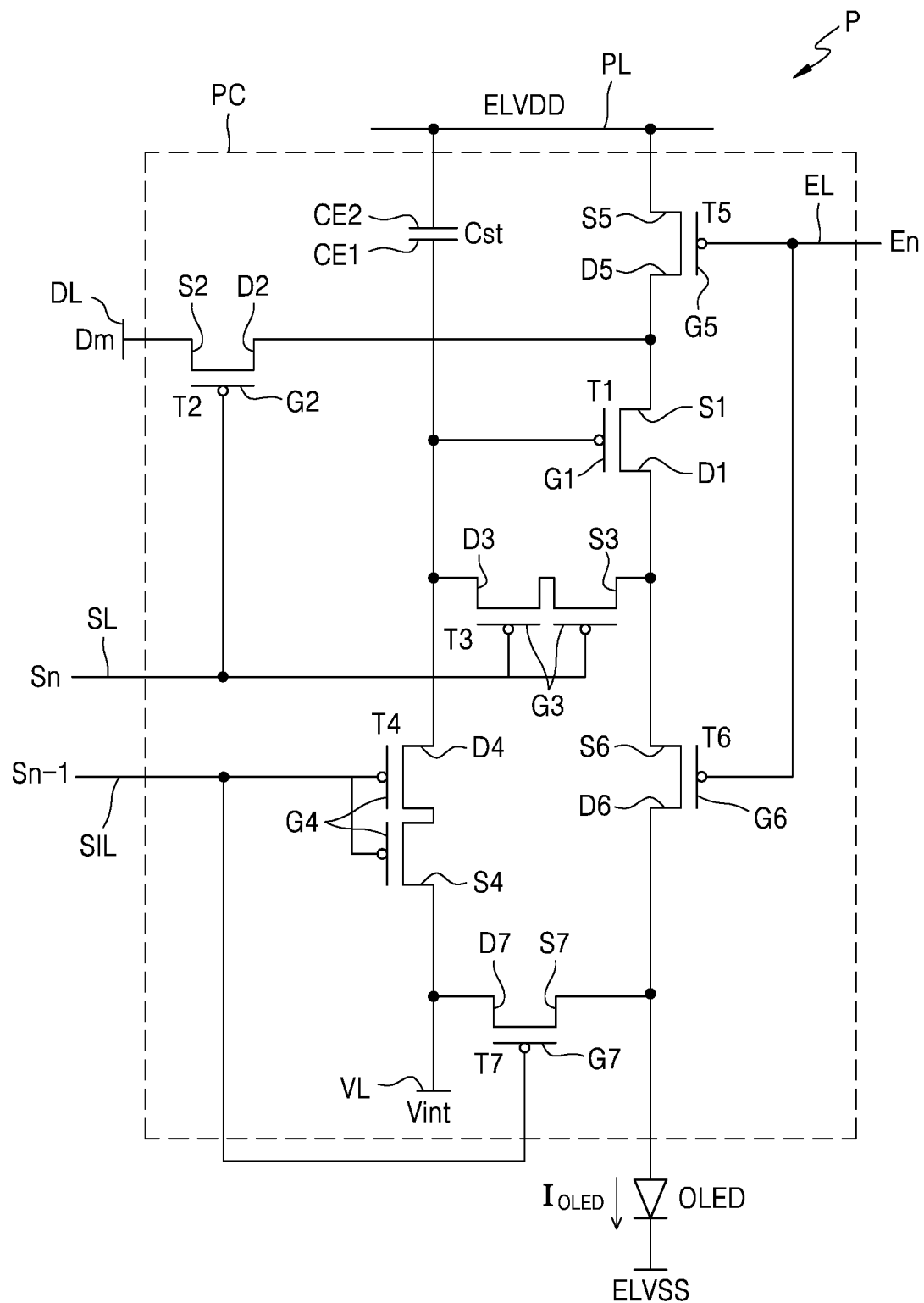

FIGS. 2A and 2B are equivalent circuit diagrams of pixels according to one or more embodiments of the present disclosure.

Referring to FIG. 2A, each pixel P may include a pixel circuit PC and an organic light-emitting diode OLED connected to the pixel circuit PC. The pixel circuit PC may include a driving thin film transistor T1, a switching thin film transistor T2, and a storage capacitor Cst.

The switching thin film transistor T2 may be connected to a scan line SL and a data line DL and may be configured to transmit a data voltage input from the data line DL to the driving thin film transistor T1 according to a switching voltage input from the scan line SL. The storage capacitor Cst may be connected to the switching thin film transistor T2, and a driving voltage line PL and may store a voltage corresponding to the difference between a voltage received from the switching thin film transistor T2 and a driving voltage ELVDD supplied to the driving voltage line PL.

The driving thin film transistor T1 may be connected to the driving voltage line PL and the storage capacitor Cst and may control a driving current flowing from the driving voltage line PL through (to) the organic light-emitting diode OLED in response to a voltage value stored in the storage capacitor Cst. The organic light-emitting diode OLED may emit light with a certain brightness corresponding to the driving current. An opposite electrode (e.g., a cathode) of the organic light-emitting diode OLED may receive a common voltage ELVSS.

Although FIG. 2A illustrates that the pixel circuit PC includes two thin film transistors and one storage capacitor, the present disclosure is not limited thereto. The number of thin film transistors and the number of storage capacitors may be modified according to the design of the pixel circuit PC.

Referring to FIG. 2B, the pixel circuit PC may include a plurality of thin film transistors and a storage capacitor. The thin film transistors and the storage capacitor may be connected to signal lines SL, SIL, EL, and DL, an initialization voltage line VL, and a driving voltage line PL.

Although FIG. 2B illustrates that each pixel P is connected to the signal lines SL, SIL, EL, and DL, the initialization voltage line VL, and the driving voltage line PL, the present disclosure is not limited thereto. In other embodiments, at least one of the signal lines SL, SIL, EL, and DL, the initialization voltage line VL, the driving voltage line PL, and/or the like may be shared by adjacent pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include a scan line SL configured to transmit a scan signal Sn; a previous scan line SIL transmitting a previous scan signal Sn−1 to the first initialization thin film transistor T4 and the second initialization thin film transistor T7; an emission control line EL transmitting an emission control signal En to the operation control thin film transistor T5 and the emission control thin film transistor T6, and a data line DL intersecting or crossing the scan line SL and transmitting a data signal Dm. The driving voltage line PL may be configured to transmit the driving voltage ELVDD to the driving thin film transistor T1, and the initialization voltage line VL may transmit an initialization voltage Vint for initializing the driving thin film transistor T1 and a pixel electrode.

A driving gate electrode G1 of the driving thin film transistor T1 may be connected to a first storage capacitor plate CE1 of the storage capacitor Cst, a driving source electrode S1 of the driving thin film transistor T1 may be electrically connected to the driving voltage line PL via the operation control thin film transistor T5, and a driving drain electrode D1 of the driving thin film transistor T1 may be electrically connected to the pixel electrode of the organic light-emitting diode OLED via the emission control thin film transistor T6. The driving thin film transistor T1 may receive the data signal Dm according to a switching operation of the switching thin film transistor T2 and supply a driving current IDLED to the organic light-emitting diode OLED.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and connected to the driving voltage line PL via the operation control thin film transistor T5. The switching thin film transistor T2 may be turned on according to the scan signal Sn received through the scan line SL, to perform a switching operation of transmitting the data signal Dm (transmitted to the data line DL) to the source electrode S1 of the driving thin film transistor T1.

A compensation gate electrode G3 of the compensation thin film transistor T3 may be connected to the scan line SL, a compensation source electrode S3 of the compensation thin film transistor T3 may be connected to the driving drain electrode D1 of the driving thin film transistor T1 and connected to the pixel electrode of the organic light-emitting diode OLED via the emission control thin film transistor T6, and a compensation drain electrode D3 of the compensation thin film transistor T3 may be connected to the first storage capacitor plate CE1 of the storage capacitor Cst, the first initialization drain electrode D4 of the first initialization thin film transistor T4, and the driving gate electrode G1 of the driving thin film transistor T1. The compensation thin film transistor T3 may be turned on according to the scan signal Sn received through the scan line SL, to electrically connect the driving gate electrode G1 and the driving drain electrode D1 of the driving thin film transistor T1, to thereby diode-connect the driving thin film transistor T1.

A first initialization gate electrode G4 of the first initialization thin film transistor T4 may be connected to the previous scan line SIL, a first initialization source electrode S4 of the first initialization thin film transistor T4 may be connected to a second initialization drain electrode D7 of the second initialization thin film transistor T7 and the initialization voltage line VL, and a first initialization drain electrode D4 of the first initialization thin film transistor T4 may be connected to the first storage capacitor plate CE1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn−1 received through the previous scan line SIL, to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the organic light-emitting diode OLED.

The operation control thin film transistor T5 and the emission control thin film transistor T6 may be simultaneously (or concurrently) turned on according to the emission control signal EM received through the emission control line EL, such that the driving voltage ELVDD may be transmitted to the organic light-emitting diode OLED and thus the driving current IDLED may flow through the organic light-emitting diode OLED.

A second initialization gate electrode G7 of the second initialization thin film transistor T7 may be connected to the previous scan line SIL, the second initialization source electrode S7 of the second initialization thin film transistor T7 may be connected to the emission control drain electrode D6 of the emission control thin film transistor T6 and the pixel electrode of the organic light-emitting diode OLED, and the second initialization drain electrode D7 of the second initialization thin film transistor T7 may be connected to the first initialization source electrode S4 of the first initialization thin film transistor T4 and the initialization voltage line VL. The second initialization thin film transistor T7 may be turned on according to the previous scan signal Sn−1 received through the previous scan line SIL, to initialize the pixel electrode of the organic light-emitting diode OLED.

Although FIG. 2B illustrates a case where the first initialization thin film transistor T4 and the second initialization thin film transistor T7 are connected to the previous scan line SIL, the present disclosure is not limited thereto. In other embodiments, the first initialization thin film transistor T4 may be connected to the previous scan line SIL to be driven according to the previous scan signal Sn−1, and the second initialization thin film transistor T7 may be connected to a separate signal line (e.g., a subsequent scan line) to be driven according to a signal transmitted to the separate signal line.

A second storage capacitor plate CE2 of the storage capacitor Cst may be connected to the driving voltage line PL, and the opposite electrode of the organic light-emitting diode OLED may be connected to the common voltage ELVSS. Accordingly, the organic light-emitting diode OLED may receive the driving current IDLED from the driving thin film transistor T1 to emit light to display an image.

Although FIG. 2B illustrates that the compensation thin film transistor T3 and the first initialization thin film transistor T4 have dual gate electrodes, the compensation thin film transistor T3 and the first initialization thin film transistor T4 may each have one gate electrode.

Figure 3:
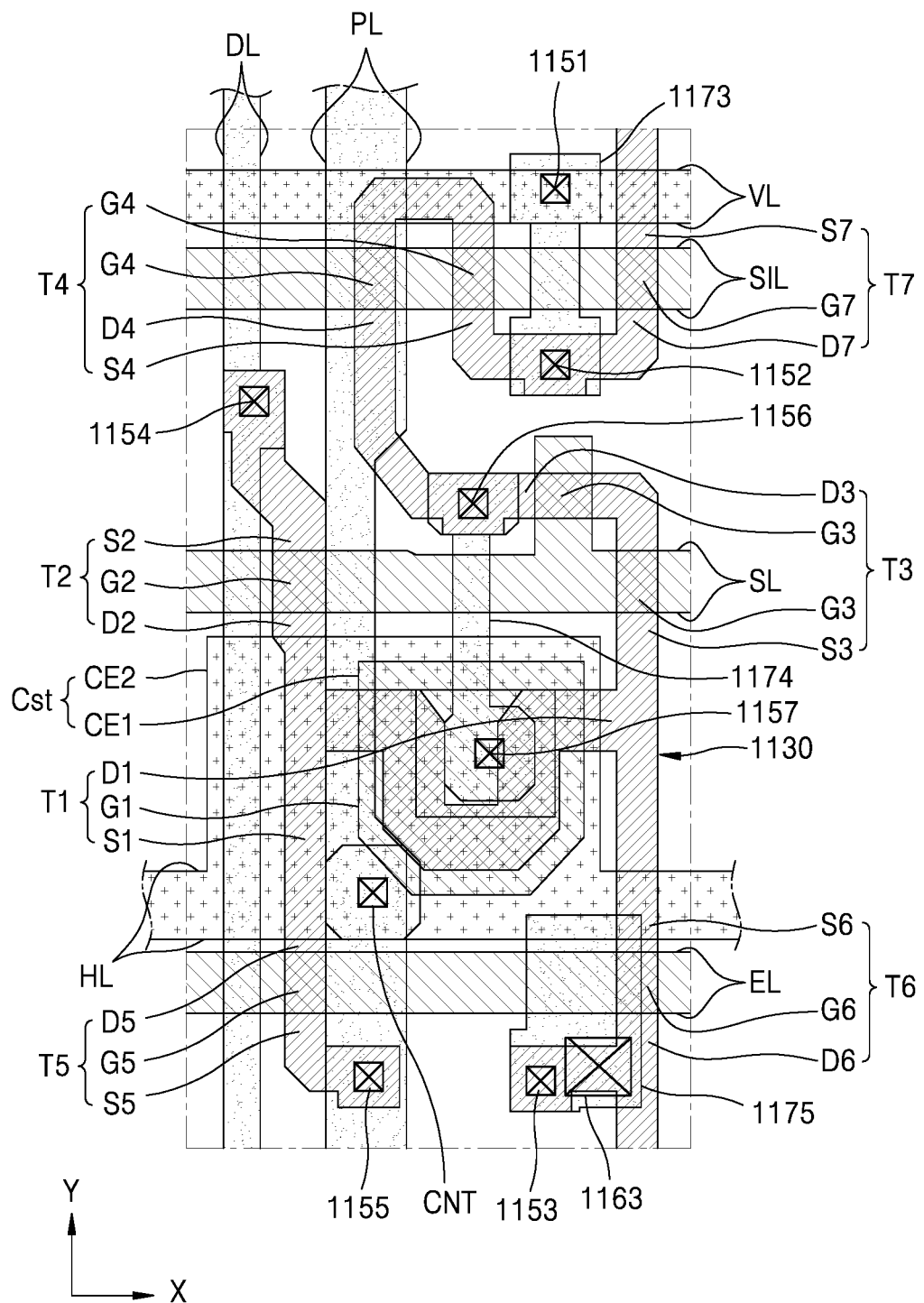
FIG. 3 is a planar layout diagram of a pixel circuit according to one or more of the present embodiments.

FIG. 3 is a planar layout diagram of a pixel circuit according to the present embodiments.

Referring to FIG. 3, the driving thin film transistor T1, the switching thin film transistor T2, the compensation thin film transistor T3, the first initialization thin film transistor T4, the operation control thin film transistor T5, and the emission control thin film transistor T6, and the second initialization thin film transistor T7 may be arranged along a semiconductor layer 1130. The semiconductor layer 1130 may be arranged on a substrate where a buffer layer of an inorganic insulating material is formed.

Some areas of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. For example, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and may be bent in various suitable shapes.

The semiconductor layer 1130 may include a channel area, and a source area and a drain area on and/or at both sides of the channel area, and the source area and the drain area may be understood as the source electrode and the drain electrode of the corresponding thin film transistor. Hereinafter, for convenience, the source area and the drain area will be respectively referred to as a source electrode and a drain electrode.

The driving thin film transistor T1 may include a driving gate electrode G1 overlapping a driving channel area, and a driving source electrode S1 and a driving drain electrode D1 on and/or at both sides of the driving channel area. The driving channel area overlapping the driving gate electrode G1 may have a bent shape, such as an omega shape, to form a long channel length in a narrow space. When the driving channel area is long, the driving range of a gate voltage may become wider, and thus the gradation of light emitted from the organic light-emitting diode OLED may be more finely controlled and the display quality thereof may be improved.

The switching thin film transistor T2 may include a switching gate electrode G2 overlapping a switching channel area, and a switching source electrode S2 and a switching drain electrode D2 on and/or at both sides of the switching channel area. The switching drain electrode D2 may be connected to the driving source electrode S1.

The compensation thin film transistor T3 may be a dual thin film transistor, may include compensation gate electrodes G3 overlapping two compensation channel areas, and may include a compensation source electrode S3 and a compensation drain electrode D3 arranged on and/or at both sides thereof. The compensation thin film transistor T3 may be connected to the driving gate electrode G1 of the driving thin film transistor T1 through a node connection line 1174 which will be described in more detail below.

The first initialization thin film transistor T4 may be a dual thin film transistor, may include a first initialization gate electrode G4 overlapping two first initialization channel areas, and may include a first initialization source electrode S4 and a first initialization drain electrode D4 arranged on and/or at both sides thereof.

The operation control thin film transistor T5 may include an operation control gate electrode G5 overlapping an operation control channel area, and an operation control source electrode S5 and an operation control drain electrode D5 located on and/or at both sides thereof. The operation control drain electrode D5 may be connected to the driving source electrode S1.

The emission control thin film transistor T6 may include an emission control gate electrode G6 overlapping an emission control channel area, and an emission control source electrode S6 and an emission control drain electrode D6 located on and/or at both sides thereof. The emission control source electrode S6 may be connected to the driving drain electrode D1.

The second initialization thin film transistor T7 may include a second initialization gate electrode G7 overlapping a second initialization channel area, and a second initialization source electrode S7 and a second initialization drain electrode D7 located on and/or at both sides thereof.

The thin film transistors described above may be connected to the signal lines SL, SIL, EL, and DL, the initialization voltage line VL, and the driving voltage line PL.

The scan line SL, the previous scan line SIL, the emission control line EL, and the driving gate electrode G1 may be arranged over the semiconductor layer 1130, with one or more insulating layers therebetween.

The scan line SL may extend along a first direction (e.g., first direction X). Areas of the scan line SL may correspond to the switching and compensation gate electrodes G2 and G3. For example, the areas of the scan line SL overlapping the channel areas of the switching and compensation thin film transistors T2 and T3 may respectively be (or correspond to) the switching and compensation gate electrodes G2 and G3.

The previous scan line SIL may extend along the first direction, and some areas thereof may respectively correspond to the first and second initialization gate electrodes G4 and G7. For example, the areas of the previous scan line SIL overlapping the channel areas of the first and second initialization thin film transistors T4 and T7 may respectively be (or correspond to) the first and second initialization gate electrodes G4 and G7.

The emission control line EL may extend along the first direction. Areas of the emission control line EL may respectively correspond to the operation control and emission control gate electrodes G5 and G6. For example, the areas of the emission control line EL overlapping the channel areas of the operation control and emission control thin film transistors T5 and T6 may respectively be (or correspond to) the operation control and emission control gate electrodes G5 and G6.

The driving gate electrode G1 may be a floating electrode and may be connected to the compensation thin film transistor T3 through the node connection line 1174 described above.

An electrode voltage line HL may be arranged over the scan line SL, the previous scan line SIL, the emission control line EL, and the driving gate electrode G1 with one or more insulating layers therebetween.

The electrode voltage line HL may extend along the first direction to intersect or cross the data line DL and the driving voltage line PL. A portion of the electrode voltage line HL may cover at least a portion of the driving gate electrode G1, and may form the storage capacitor Cst with the driving gate electrode G1. For example, the driving gate electrode G1 may become the first storage capacitor plate CE1 of the storage capacitor Cst and a portion of the electrode voltage line HL may become the second storage capacitor plate CE2 of the storage capacitor Cst.

The second storage capacitor plate CE2 of the storage capacitor Cst may be electrically connected to the driving voltage line PL. In this regard, the electrode voltage line HL may be connected through a contact hole CNT to the driving voltage line PL arranged on the electrode voltage line HL. Thus, the electrode voltage line HL may have the same voltage level (e.g., constant voltage) as the driving voltage line PL. For example, the electrode voltage line HL may have a constant voltage of +5 V. The electrode voltage line HL may be understood as a horizontal driving voltage line.

Because the driving voltage line PL extends along a second direction Y, and the electrode voltage line HL electrically connected to the driving voltage line PL extends along the first direction X intersecting or crossing the second direction Y, a plurality of driving voltage lines PL and a plurality of electrode voltage lines HL may form a mesh structure in a display area.

The data line DL, the driving voltage line PL, an initialization connection line 1173, and the node connection line 1174 may be arranged over the electrode voltage line HL with one or more insulating layers therebetween.

The data line DL may extend in the second direction (e.g., second direction Y) and may be connected to the switching source electrode S2 of the switching thin film transistor T2 through a contact hole 1154. A portion of the data line DL may be understood as (e.g., may correspond to) a switching source electrode.

The driving voltage line PL may extend in the second direction Y and may be connected to the electrode voltage line HL through the contact hole CNT as described above. Also, it may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and the other end thereof may be connected to the initialization voltage line VL through a contact hole 1151, which will be described in more detail below.

One end of the node connection line 1174 may be connected to the compensation drain electrode D3 through a contact hole 1156, and the other end thereof may be connected to the driving gate electrode G1 through a contact hole 1157.

The initialization voltage line VL may be arranged over the data line DL, the driving voltage line PL, the initialization connection line 1173, and the node connection line 1174 with one or more insulating layers therebetween.

The initialization voltage line VL may extend in the first direction. The initialization voltage line VL may be connected to the first and second initialization thin film transistors T4 and T7 through the initialization connection line 1173. The initialization voltage line VL may have a constant voltage (e.g., −2 V).

The initialization voltage line VL may include the same material and may be arranged in the same layer as the second storage capacitor plate CE2, for example, the electrode voltage line HL. In the display area DA, the pixel electrode of the organic light-emitting diode OLED may be connected to the emission control thin film transistor T6. The pixel electrode may be connected to a connection metal 1175 through a contact hole 1163, and the connection metal 1175 may be connected to the emission control drain electrode D6 through a contact hole 1153.

Meanwhile, in FIG. 3, the source electrode and the drain electrode of the thin film transistors may be changed with each other according to the characteristics of the thin film transistors.

Figure 4:
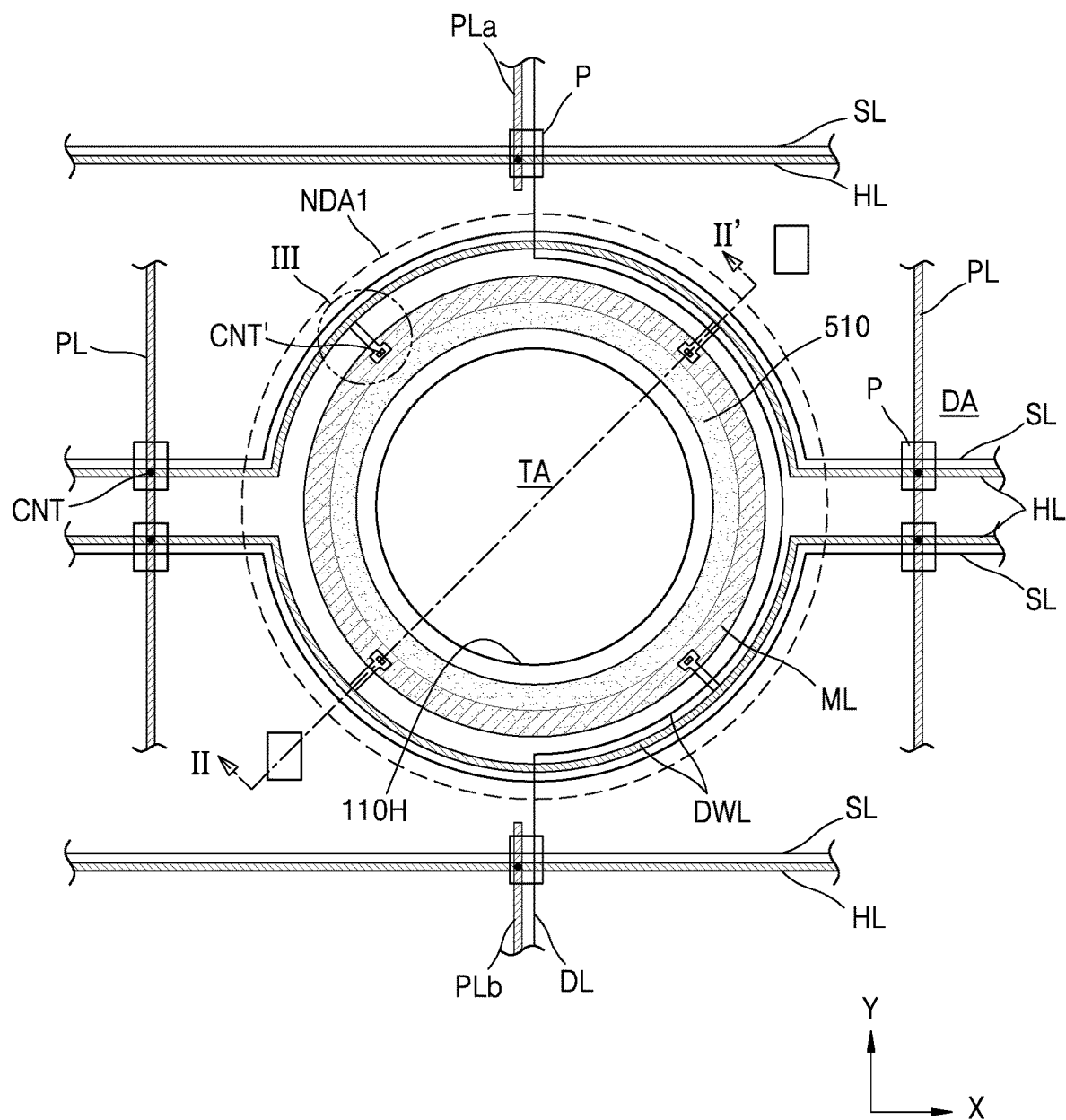
FIG. 4 is a plan view schematically illustrating arrangements of some of the lines around a transmission area according to an embodiment.
Figure 5A:
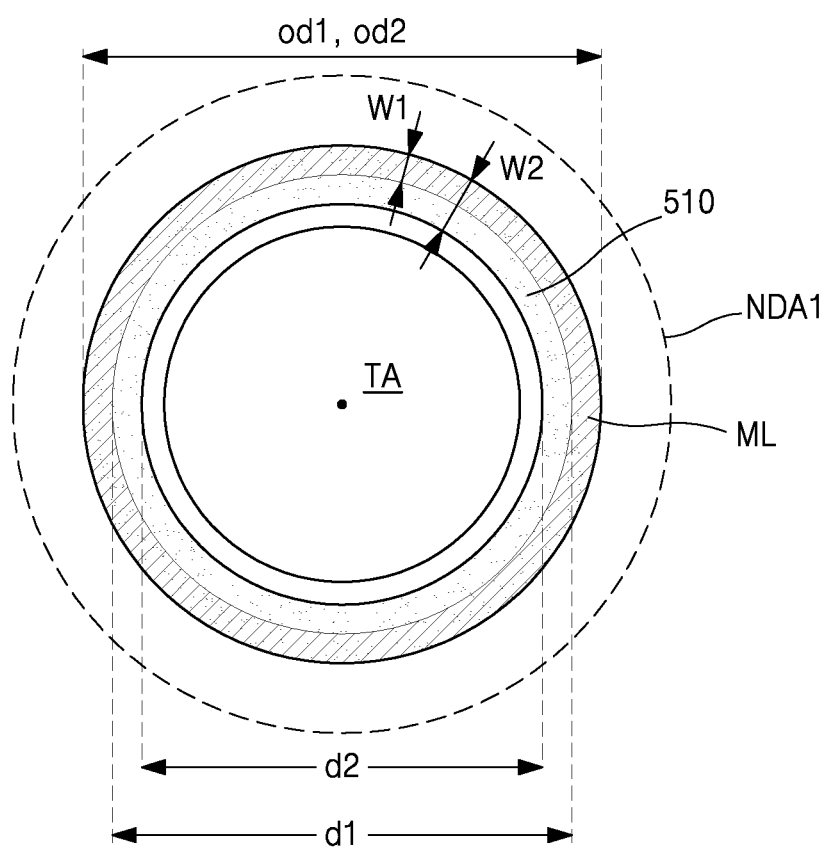
FIG. 5A is a plan view illustrating the relationship between a first sealing member and a metal layer among components around a transmission area.
Figure 5B:
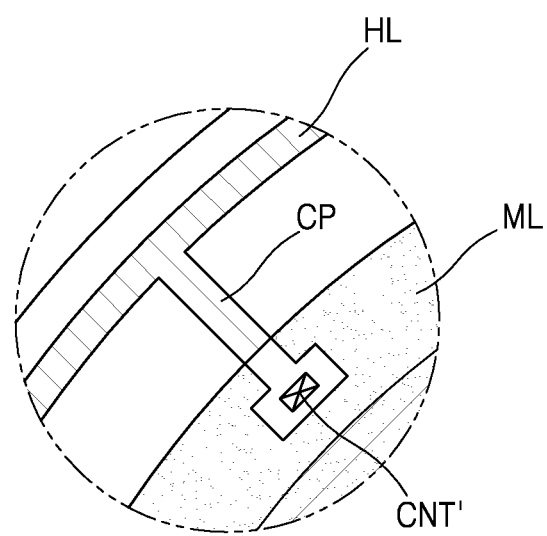
FIG. 5B is an enlarged view of region III of FIG. 4.
Figure 6:
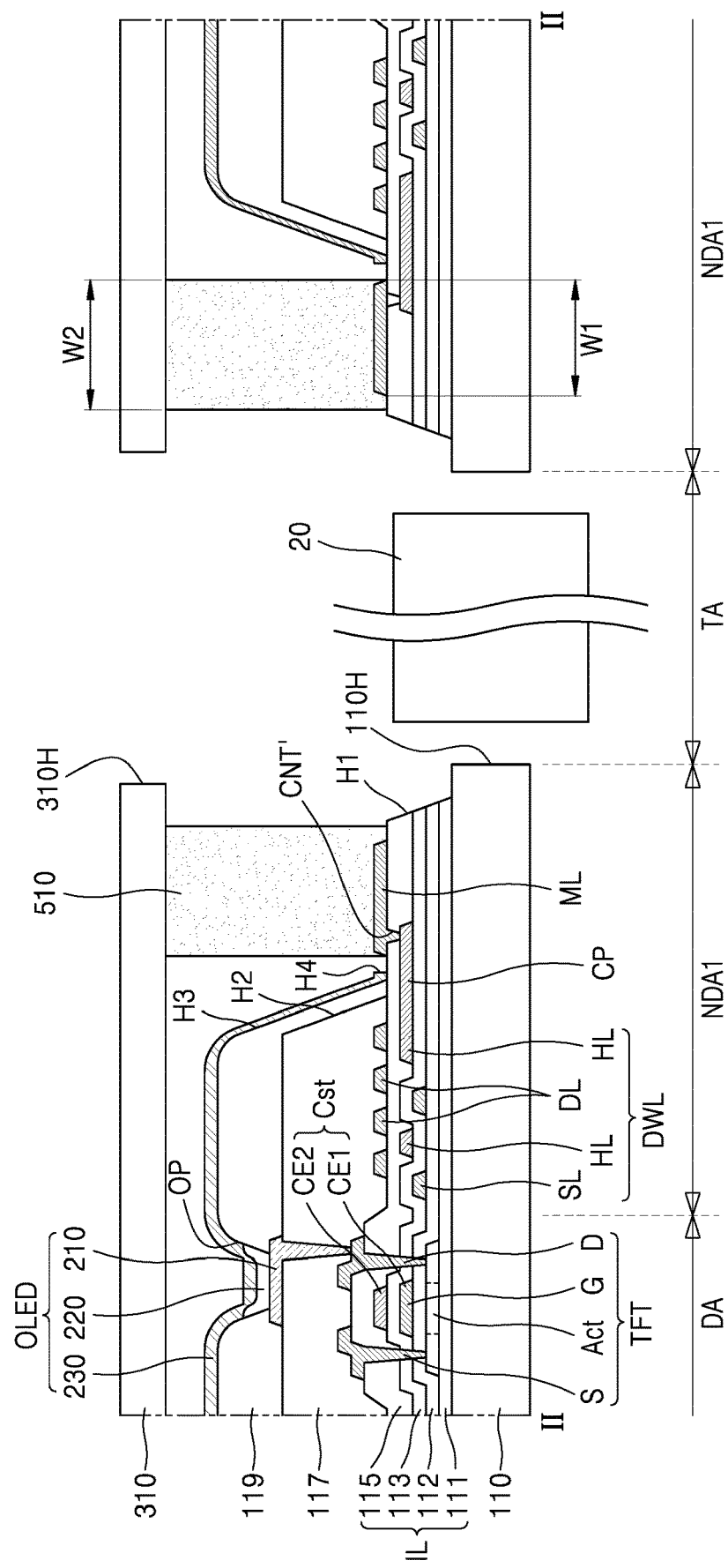
FIG. 6 is a schematic cross-sectional view of the display panel taken along line II-II' of FIG. 4.

FIG. 4 is a plan view schematically illustrating arrangements of some of the components around the transmission area TA as an embodiment. FIG. 5A is a plan view illustrating the relationship between the first sealing member 510 and a metal layer ML among the components around the transmission area TA. FIG. 5B is an enlarged view of a region III of FIG. 4. FIG. 6 is a schematic cross-sectional view of the display panel taken along a line II-II' of FIG. 4.

First, referring to FIG. 4, various lines may be arranged around the transmission area TA. FIG. 4 illustrates portions of the scan line SL, the data line DL, the driving voltage line PL, and the electrode voltage line HL around the transmission area TA. In the drawings, some lines connected to the pixel are omitted in the illustration.

The scan lines SL and the electrode voltage lines HL may extend along the first direction X and may be arranged to bypass along the edge of the transmission area TA in the first non-display area NDA1.

For example, in the first non-display area NDA1, the scan lines SL may bypass around the transmission area TA. In some embodiments, the scan lines SL and the electrode voltage lines HL may extend along the first direction X and may be bent and arranged along the edge of the first through hole 110H.

For example, some scan lines SL may be curved along the upper edge of the transmission area TA, and other scan lines SL may be curved along the lower edge of the transmission area TA. The pixels P located on the left and right sides of the transmission area TA may be electrically connected to the scan lines SL bypassing the transmission area TA.

In the first non-display area NDA1, the electrode voltage lines HL may bypass around the transmission area TA. For example, some electrode voltage lines HL may be curved along the upper edge of the transmission area TA, and other electrode voltage lines HL may be curved along the lower edge of the transmission area TA. The pixels P located on the left and right sides of the transmission area TA may be electrically connected to the electrode voltage lines HL bypassing the transmission area TA.

The data lines DL may extend along the second direction Y and may be arranged to bypass along the edge of the transmission area TA in the first non-display area NDA1. For example, some data lines DL may be curved along the left edge of the transmission area TA, and other data lines DL may be curved along the right edge of the transmission area TA. The pixels P located on the upper and lower sides of the transmission area TA may be electrically connected to the data lines DL bypassing the transmission area TA.

In some embodiments, driving voltage lines PLa and PLb around the transmission area TA may be disconnected on the transmission area TA. For example, the first driving voltage line PLa and the second driving voltage line PLb arranged on the same line along the second direction Y may be spaced apart from each other with the transmission area TA therebetween. The driving voltage line PL not passing through the transmission area TA may be continuously arranged in the display area DA.

The driving voltage lines PLa, PLb, and PL and the electrode voltage lines HL may be connected to each pixel P through the contact hole CNT. Because the driving voltage lines PLa, PLb, and PL extend along the second direction, and the electrode voltage line HL electrically connected to the driving voltage lines PLa, PLb, and PL extend along the first direction intersecting or crossing the second direction, a plurality of driving voltage lines PLa, PLb, and PL and a plurality of electrode voltage lines HL may thus form a mesh structure. Accordingly, even when the driving voltage lines PLa and PLb around the transmission area TA are disconnected without bypassing (e.g., passing through) the transmission area TA, the driving voltage ELVDD may be substantially uniformly applied to a plurality of pixels P.

The electrode voltage line HL may extend from the second storage capacitor plate CE2 of the storage capacitor Cst as described with reference to FIG. 3.

In some embodiments, the lines bypassing (e.g., passing through) the periphery of the transmission area TA may be integrated with the lines arranged in the display area DA. In other embodiments, the lines bypassing the periphery of the transmission area TA may be provided as connection lines arranged in the same layer as, or in different layers than, the lines arranged in the display area DA.

Referring to FIGS. 4 to 6, in the present embodiment, the first sealing member 510 may be arranged to surround the transmission area TA, and the metal layer ML may be arranged under the first sealing member 510. The first sealing member 510 and the metal layer ML may be arranged to surround the transmission area TA and may have a ring shape or a donut shape. The shape of the first sealing member 510 and the metal layer ML may be modified according to the shape of the transmission area TA. For example, when the transmission area TA is elliptical, the first sealing member 510 and the metal layer ML may also each be provided as an elliptical ring.

As described with reference to FIG. 1B, as the width of the first sealing member 510 is small, the bonding force by the first sealing member 510 may be weak.

In the present embodiment, the sealing property of the first sealing member 510 may be improved by introducing the metal layer ML under the first sealing member 510.

The metal layer ML may be formed of a material having a high bonding force with the first sealing member 510 to improve the sealing property by the first sealing member 510. Also, when the first sealing member 510 is cured by a laser, the metal layer ML may function to assist the curing by transmitting heat to the first sealing member 510 by absorbing and/or reflecting laser light.

The inner edge of the metal layer ML (facing the transmission area TA) may be covered by the first sealing member 510. For example, an inner diameter d1 of the metal layer ML may be greater than an inner diameter d2 of the first sealing member 510 (d1>d2).

This may be to prevent or reduce the likelihood of the metal layer ML being exposed to the transmission area TA. When a portion of the inner edge of the metal layer ML is exposed without being covered by the first sealing member 510, it may be corroded by moisture and/or the like that may flow from the transmission area TA. In the present embodiment, the inner edge of the metal layer ML may be covered by the first sealing member 510 to prevent or reduce the corrosion of the metal layer ML.

An outer diameter od1 of the metal layer ML may be substantially the same as an outer diameter od2 of the first sealing member 510 (od1=od2).

This may be to reduce the area of the first non-display area NDA1 and also to efficiently (or suitably) cure the first sealing member 510. When the outer diameter od1 of the metal layer ML is greater than the outer diameter od2 of the first sealing member 510, the area of the area NDA1 may be relatively large when considering the lines arranged in the first non-display area NDA1. On the other hand, when the outer diameter od1 of the metal layer ML is smaller than the outer diameter od2 of the first sealing member 510, the heat energy transmitted to the first sealing member 510 by the metal layer ML may be reduced. In the present embodiment, the outer diameter od1 of the metal layer ML may be substantially the same as the outer diameter od2 of the first sealing member 510 to minimize or reduce the first non-display area NDA1 and also to efficiently (or suitably) cure the first sealing member 510.

In some embodiments, the metal layer ML may be for bonding to the first sealing member 510 and may be arranged only under the first sealing member 510, and a width W1 of the metal layer ML may be lower than a width W2 of the first sealing member 510 (W1<W2).

In some embodiments, a metal layer may also be arranged under the second sealing member 520.

Referring to FIGS. 4 and 5B, the metal layer ML may be electrically connected to a bypass line bypassing the transmission area TA. In contrast, when the metal layer ML is electrically floated, electrostatic charges may be collected in the metal layer ML, from which damage due to electrostatic discharge may occur.

However, in the present embodiment, a phenomenon caused by the electrostatic discharge may be prevented or reduced by electrically connecting the metal layer ML to at least one bypass line. The bypass line may be a line of the electrode voltage line HL adjacent to the metal layer ML. Accordingly, the metal layer ML may receive the driving voltage ELVDD, that is a constant voltage.

The bypass line and the metal layer ML may be connected by a connection portion CP. The connection portion CP may be a conductive layer extending from the bypass line to the center of the transmission area TA.

In some embodiments, the connection portion CP may protrude from the electrode voltage line HL, which is the bypass line, toward the center of the transmission area TA and extend to the metal layer ML. For example, the connection portion CP may be integrally formed with the electrode voltage line HL. The connection portion CP may overlap the metal layer ML, and the metal layer ML may be connected to the connection portion CP through a contact hole CNT'.

The connection portion CP may be provided in plurality and may be arranged along the edge of the metal layer ML. Also, the bypass line connected to the metal layer ML may be provided in plurality. For example, the metal layer ML may be connected to a line arranged most adjacent to the metal layer ML among the electrode voltage lines HL bypassing along the upper side of the transmission area TA and to a line arranged most adjacent to the metal layer ML among the electrode voltage lines HL bypassing along the lower side of the transmission area TA.

In other embodiments, each connection portion CP may be arranged in a different layer than the electrode voltage line HL and the metal layer ML, and connected to the electrode voltage line HL and the metal layer ML by a contact hole.

Referring to FIG. 6, the electronic element 20 may be arranged to correspond to the transmission area TA of the display panel.

The electronic element 20 may be located in the transmission area TA. In some embodiments, as illustrated in the drawings, the electronic element 20 may be arranged to be at least partially inserted into the first through hole 110H of the first substrate 110. In other embodiments, the electronic element 20 may be arranged under the first substrate 110 to correspond to the transmission area TA.

The electronic element 20 may include an electronic element using light and/or sound. For example, the electronic element may include a sensor such as an infrared sensor for receiving and using light, a camera for receiving light to capture an image, a sensor for outputting and detecting light and/or sound to measure a distance and/or recognize a fingerprint and/or the like, a miniature lamp for outputting light, and/or a speaker for outputting sound. In the case of an electronic element using light, it may use light of various wavelength bands such as visible light, infrared light, and/or ultraviolet light.

The display panel according to the present embodiment may include: a first substrate 110 including a transmission area TA, a display area DA where display elements are arranged, and a first non-display area NDA1; a second substrate 310 facing the first substrate 110; a first sealing member 510 between the first substrate 110 and the second substrate 310 around the transmission area TA; and a metal layer ML under the first sealing member 510. The metal layer ML may be electrically connected to at least one bypass line bypassing the transmission area TA.

The first substrate 110 and the second substrate 310 may each independently include a glass material or include a polymer resin. For example, the first substrate 110 may include a glass material having $SiO_2$ as a main component, or may include a resin such as reinforced plastic. The second substrate 310 may be arranged to face the first substrate 110 to cover the display elements.

At least one thin film transistor TFT, a storage capacitor Cst, and an organic light-emitting diode OLED as a display element may be arranged in the display area DA of the first substrate 110.

The thin film transistor TFT may include a semiconductor layer Act, a gate electrode G, a source electrode S, and a drain electrode D. The storage capacitor Cst may include a first storage capacitor plate CE1 and a second storage capacitor plate CE2. The organic light-emitting diode OLED may include a pixel electrode 210, an intermediate layer 220 including an organic emission layer, and an opposite electrode 230.

Hereinafter, the configurations thereof will be described in the stacking order.

A buffer layer 111 may be arranged on the first substrate 110 to reduce or block the penetration of foreign materials, moisture, and/or outside air from under the first substrate 110, and to provide a flat surface on the first substrate 110.

The buffer layer 111 may include an inorganic material such as oxide and/or nitride, an organic material, or an organic/inorganic composite, and may include a single-layer or a multi-layer structure of an inorganic material and an organic material.

A barrier layer may be further included between the first substrate 110 and the buffer layer 111. The barrier layer may function to prevent or minimize (or reduce) the penetration of impurities from the first substrate 110 and/or the like into the semiconductor layer Act. The barrier layer may include an inorganic material such as oxide and/or nitride, an organic material, or an organic/inorganic composite, and may include a single-layer or a multi-layer structure of an inorganic material and an organic material.

The semiconductor layer Act may be arranged on the buffer layer 111. The semiconductor layer Act may include amorphous silicon or may include polysilicon. In other embodiments, the semiconductor layer Act may include an oxide of at least one selected from indium (In), gallium (Ga), stannum (Sn), zirconium (Zr), vanadium (V), hafnium (Hf), cadmium (Cd), and germanium (Ge), chromium (Cr), titanium (Ti), aluminum (Al), cesium (Cs), cerium (Ce), and zinc (Zn). In some embodiments, the semiconductor layer Act may include a Zn oxide-based material such as a Zn oxide, an In—Zn oxide, and/or a Ga—In—Zn oxide. In other embodiments, the semiconductor layer Act may include IGZO (In—Ga—Zn—O), ITZO (In—Sn—Zn—O), and/or IGTZO (In—Ga—Sn—Zn—O) semiconductor containing a metal such as indium (In), gallium (Ga), and/or tin (Sn) in ZnO. The semiconductor layer Act may include a channel area, and a source area and a drain area arranged on and/or at both sides of the channel area. The semiconductor layer Act may include a single layer or multiple layers.

Over the semiconductor layer Act, the gate electrode G may be arranged to at least partially overlap the semiconductor layer Act with a first gate insulating layer 112 therebetween. The gate electrode G may include molybdenum (Mo), aluminum (Al), copper (Cu), titanium (Ti), and/or the like, and may include a single layer or multiple layers. For example, the gate electrode G may include a single layer of Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A second gate insulating layer 113 may be provided to cover the gate electrode G. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The first storage capacitor plate CE1 of the storage capacitor Cst may overlap the thin film transistor TFT. For example, the gate electrode G of the thin film transistor TFT may function as the first storage capacitor plate CE1 of the storage capacitor Cst.

The second storage capacitor plate CE2 of the storage capacitor Cst may overlap the first storage capacitor plate CE1 with the second gate insulating layer 113 therebetween. In this case, the second gate insulating layer 113 may function as a dielectric layer of the storage capacitor Cst. The second storage capacitor plate CE2 may include a conductive material including molybdenum (Mo), aluminum (Al), copper (Cu), titanium (Ti), and/or the like, and may include a single layer or multiple layers including any of the above materials. For example, the second storage capacitor plate CE2 may include a single layer of Mo or a multilayer structure of Mo/Al/Mo.

In the drawings, the storage capacitor Cst is illustrated as overlapping the thin film transistor TFT, however, in other embodiments, as one of various modifications, the storage capacitor Cst may be arranged not to overlap the thin film transistor TFT.

An interlayer insulating layer 115 may be provided to cover the second storage capacitor plate CE2 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

The source electrode S and the drain electrode D may be arranged on the interlayer insulating layer 115. The source electrode S and the drain electrode D may include a conductive material including molybdenum (Mo), aluminum (Al), copper (Cu), titanium (Ti), and/or the like, and may include a single layer or multiple layers including any of the above materials. For example, the source electrode S and the drain electrode D may include a multilayer structure of Ti/Al/Ti.

A via layer 117 may be located on the source electrode S and the drain electrode D, and the organic light-emitting diode OLED may be located on the via layer 117.

The via layer 117 may have a flat upper surface such that the pixel electrode 210 may be formed flat. In some embodiments, the via layer 117 may include a single layer or multiple layers formed of an organic material. The via layer 117 may include a general-purpose polymer such as benzocyclobutene (BCB), polyimide, hexamethyldisiloxane (HMDSO), polymethylmethacrylate (PMMA), and/or polystyrene (PS), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or any blend thereof.

In some embodiments, the via layer 117 may include an inorganic material. The via layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the via layer 117 includes an inorganic material, chemical planarization polishing may be performed in some cases. In some embodiments, the via layer 117 may include both an organic material and an inorganic material.

In the display area DA of the first substrate 110, the organic light-emitting diode OLED may be arranged on the via layer 117. The organic light-emitting diode OLED may include a pixel electrode 210, an intermediate layer 220 including an organic emission layer, and an opposite electrode 230.

The pixel electrode 210 may be a (semi)transparent electrode or a reflective electrode. In some embodiments, the pixel electrode 210 may include a reflective layer formed of Ag, Mg, Al, Pt, Pd, Au, Ni, Nd, Ir, Cr, or any compound thereof, and a transparent or semitransparent electrode layer formed on the reflective layer. The transparent or semitransparent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may include a stack structure of ITO/Ag/ITO.

A pixel definition layer 119 may be arranged on the via layer 117, and the pixel definition layer 119 may have an opening portion corresponding to each pixel electrode 210 in the display area DA, for example, an opening portion OP for exposing at least a center portion of the pixel electrode 210, to define an emission area of the pixel. Also, the pixel definition layer 119 may increase the distance between the edge of the pixel electrode 210 and the opposite electrode 230 over the pixel electrode 210, to prevent or reduce an arc and/or the like from occurring at the edge of the pixel electrode 210. The pixel definition layer 119 may be formed of an organic insulating material such as polyimide, polyamide, acrylic resin, benzocyclobutene, hexamethyldisiloxane (HMDSO), and/or phenol resin by spin coating and/or the like.

The intermediate layer 220 of the organic light-emitting diode OLED may include an organic emission layer. The organic emission layer may include an organic material including a fluorescent or phosphorescent material emitting red, green, blue, or white light. The organic emission layer may include a low-molecular organic material or a high-molecular organic material, and functional layers such as a hole transport layer (HTL), a hole injection layer (HIL), an electron transport layer (ETL), and/or an electron injection layer (EIL) may optionally be further arranged under and/or over the organic emission layer. In some embodiments, the intermediate layer 220 may be arranged corresponding to each of a plurality of pixel electrodes 210. In other embodiments, the intermediate layer 220 may include an integral (common) layer integrated over a plurality of pixel electrodes 210. For example, the organic emission layer may be arranged corresponding to each of a plurality of pixel electrodes 210, and the functional layers arranged over and/or under the organic emission layer may be integrally provided over a plurality of pixels. In other embodiments, the intermediate layer 220 may be integrally provided over a plurality of pixel electrodes 210.

The opposite electrode 230 may be a transparent electrode or a reflective electrode. In some embodiments, the opposite electrode 230 may be a transparent or semitransparent electrode and may be formed of a thin metal layer having a low work function and including Li, Ca, LiF/Ca, LiF/Al, Al, Ag, Mg, or any compound or mixture thereof. In some embodiments, a transparent conductive oxide (TCO) layer such as ITO, IZO, ZnO, and/or $In_2O_3$ may be further arranged on the thin metal layer. The opposite electrode 230 may be arranged over the display area DA and a peripheral area PA, and may be arranged on the intermediate layer 220 and the pixel definition layer 119. The opposite electrode 230 may be integrally formed in a plurality of organic light-emitting diodes OLED to correspond to a plurality of pixel electrodes 210.

A capping layer for improving light extraction efficiency and/or a protective layer formed of LiF and/or the like to protect the organic light-emitting diode OLED from a subsequent process may be further arranged on the opposite electrode 230.

A bypass line portion DWL, the first sealing member 510, and the metal layer ML may be arranged in the first non-display area NDA1 of the first substrate 110. The first sealing member 510 and the metal layer ML may be arranged more adjacent (e.g., closer) to the transmission area TA than the bypass line portion DWL.

The bypass line portion DWL may include a scan line SL, an electrode voltage line HL, and a data line DL. In some embodiments, the bypass line portion DWL may further include an emission control line, a previous scan line, and/or the like.

The scan line SL may be arranged on the first gate insulating layer 112, that is, in the same layer as the gate electrode G. The electrode voltage line HL may be arranged on the second gate insulating layer 113, that is, in the same layer as the second storage capacitor plate CE2. The data line DL may be arranged on the interlayer insulating layer 115, that is, in the same layer as the source electrode S and/or the drain electrode D.

The metal layer ML may be arranged in the same layer as the data line DL and may be spaced apart from the data line DL. The metal layer ML may be arranged on the interlayer insulating layer 115. The metal layer ML may include a conductive material including molybdenum (Mo), aluminum (Al), copper (Cu), titanium (Ti), and/or the like, and may include a single layer or multiple layers including any of the above materials.

The metal layer ML may be arranged more adjacent (e.g., closer) to the transmission area TA than the bypass line portion DWL. The metal layer ML may be connected to the connection portion CP through the contact hole CNT passing through the second gate insulating layer 113. The connection portion CP may extend from the electrode voltage line HL. As the metal layer ML is connected to the electrode voltage line HL, damage due to electrostatic discharge may be prevented or reduced.

The first sealing member 510 may be arranged to cover the metal layer ML on the interlayer insulating layer 115. The first sealing member 510 may be arranged between the first substrate 110 and the second substrate 310 to seal the first substrate 110 and the second substrate 310 to prevent or reduce oxygen, moisture, and/or the like from flowing into the display area DA.

The first sealing member 510 may include a material that is cured by laser light. The first sealing member 510 may include a frit.

The first sealing member 510 may have a stronger bonding force with the metal layer ML including a metal material than with the interlayer insulating layer 115 including an inorganic insulating material. In the present embodiment, the sealing by the first sealing member 510 may be more efficiently performed by introducing the metal layer ML between the interlayer insulating layer 115 and the first sealing member 510.

The first substrate 110 may include a first through hole 110H corresponding to the transmission area TA. As the first substrate 110 includes the first through hole 110H, the light and/or sound output from the electronic element 20 and/or received by the electronic element 20 may be more effectively (suitably) used.

When the buffer layer 111, the first gate insulating layer 112, the second gate insulating layer 113, and the interlayer insulating layer 115 are referred to as an inorganic insulating layer IL, the inorganic insulating layer IL may include a first hole H1 corresponding to the transmission area TA. The size of the first hole H1 may be larger than the size of the first through hole 110H.

The via layer 117 may include a second hole H2 corresponding to the transmission area TA. The second hole H2 may be provided to expose the metal layer ML. For example, the metal layer ML and the first sealing member 510 may be arranged inside the second hole H2.

The pixel definition layer 119 may include a third hole H3 corresponding to the transmission area TA. The third hole H3 may be provided to expose the metal layer ML. For example, the metal layer ML and the first sealing member 510 may be arranged inside the third hole H3.

The opposite electrode 230 may include a fourth hole H4 corresponding to the transmission area TA. The fourth hole H4 may be provided to expose the metal layer ML. The edge of the fourth hole H4 may be spaced apart from the metal layer ML. Accordingly, an electrical short may not occur between the opposite electrode 230 and the metal layer ML.

The second substrate 310 may include a second through hole 310H corresponding to the transmission area TA. The first through hole 110H of the first substrate 110 and the second through hole 310H of the second substrate 310 may be simultaneously (or concurrently) formed by using a laser, after bonding the first substrate 110 and the second substrate 310 by the sealing member 500 (see FIG. 1). Accordingly, the size of the second through hole 310H may be substantially the same as the size of the first through hole 110H.

Figure 7:
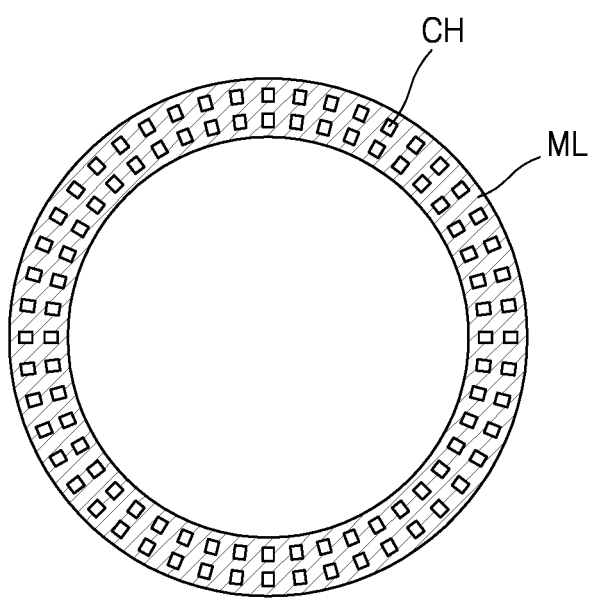
FIG. 7 is a schematic plan view illustrating the shape of a metal layer according to some embodiments.

FIG. 7 is a schematic plan view illustrating the shape of a metal layer according to some embodiments.

Referring to FIG. 7, the metal layer ML may include a plurality of through holes CH. The shape and number of through holes CH may be variously suitably modified. For example, the through holes CH may have a polygonal shape, a circular shape, an elliptical shape, and/or an irregular shape in a plan view. As the through holes CH are formed in the metal layer ML, the first sealing member 510 may be arranged inside the through holes CH to enable three-dimensional coupling. Accordingly, the bonding force between the first sealing member 510 and the metal layer ML may be enhanced.

Figure 8:
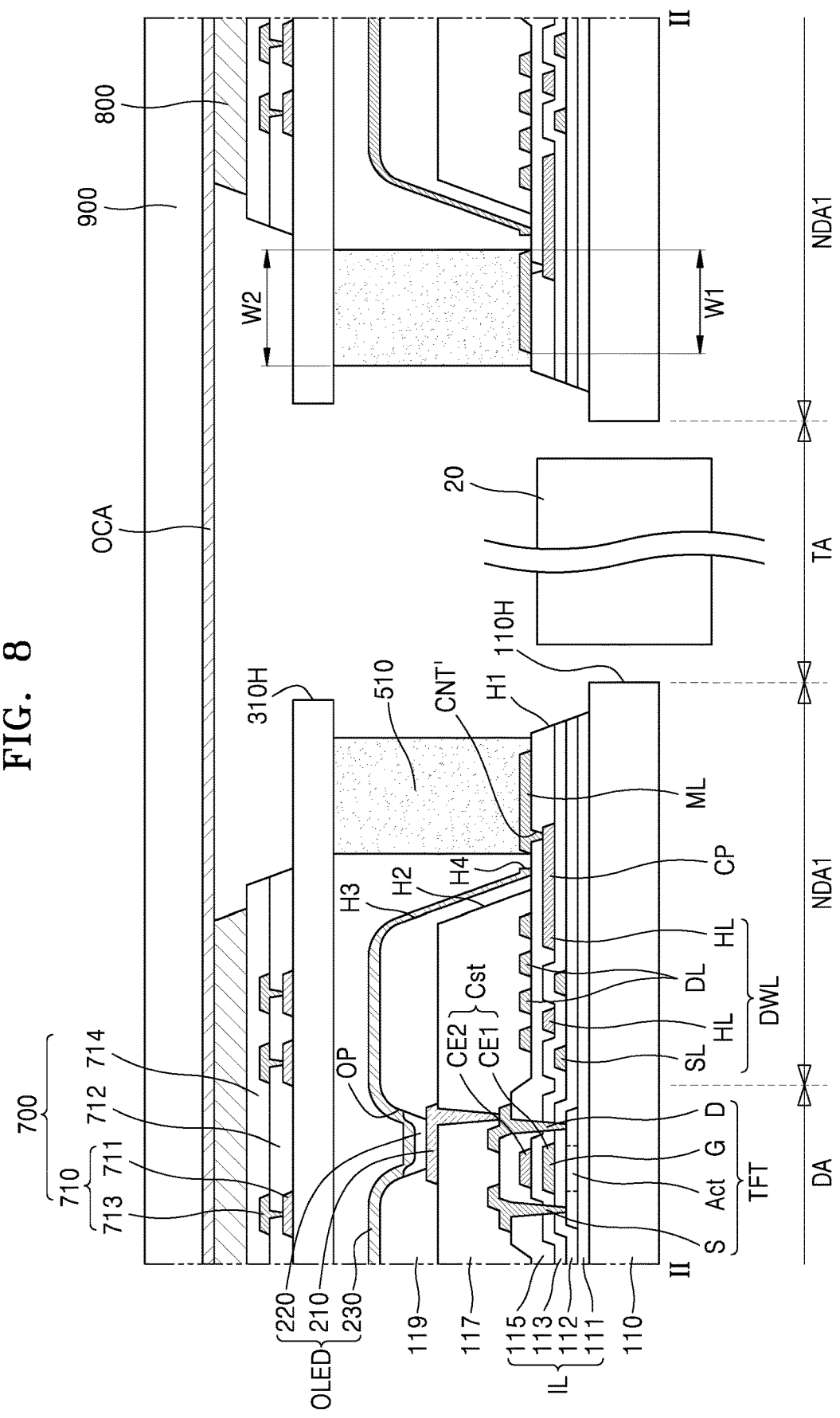
FIG. 8 is a cross-sectional view schematically illustrating a display panel according to some embodiments.

FIG. 8 is a cross-sectional view schematically illustrating a display panel according to some embodiments. In FIG. 8, like reference numerals as in FIG. 6 denote like members, and redundant descriptions thereof will not be provided for conciseness.

Referring to FIG. 8, the display panel may include: a first substrate 110 including a transmission area TA, a display area DA where display elements are arranged, and a first non-display area NDA1; a second substrate 310 arranged to face the first substrate 110; a first sealing member 510 arranged between the first substrate 110 and the second substrate 310 around the transmission area TA; and a metal layer ML arranged under the first sealing member 510. In some embodiments, the metal layer ML may be electrically connected to at least one bypass line bypassing the transmission area TA.

In the present embodiment, a touchscreen layer 700, including touch electrodes 710 of various patterns for a touchscreen function, may be provided on the second substrate 310. The touch electrode 710 may be provided as a transparent electrode material, such that the light from the emission area of pixels arranged under the touchscreen layer 700 may be transmitted therethrough. In some embodiments, the touch electrode 710 may be provided in a mesh shape, such that the light from the emission area of the pixels may be transmitted therethrough. In this case, the touch electrode 710 is not limited to a transparent electrode material. For example, the touch electrode 710 may include a single layer or multiple layers formed of a conductive material including aluminum (Al), copper (Cu), and/or titanium (Ti).

The touch electrode 710 may include a first touch conductive layer 711 and a second touch conductive layer 713. The touchscreen layer 700 according to an embodiment may have a structure in which the first touch conductive layer 711, a first insulating layer 712, the second touch conductive layer 713, and a second insulating layer 714 are sequentially stacked.

In some embodiments, the second touch conductive layer 713 may function as a sensor portion for sensing contact, and the first touch conductive layer 711 may function as a connection portion for connecting the patterned second touch conductive layer 713 in one direction.

In some embodiments, both the first touch conductive layer 711 and the second touch conductive layer 713 may function as a sensor portion. For example, the first insulating layer 712 may include a via hole for exposing the top surface of the first touch conductive layer 711, and the first touch conductive layer 711 and the second touch conductive layer 713 may be connected through the via hole. As such, as the first touch conductive layer 711 and the second touch conductive layer 713 are used, the resistance of the touch electrode 710 may be reduced and thus the response speed of the touchscreen layer 700 may be improved.

In some embodiments, the touch electrode 710 may be formed in a mesh structure to allow the light emitted from the organic light-emitting diode OLED to pass therethrough. Accordingly, the first touch conductive layer 711 and the second touch conductive layer 713 of the touch electrode 710 may be arranged not to overlap the emission area of the organic light-emitting diode OLED.

Each of the first touch conductive layer 711 and the second touch conductive layer 713 may include a single layer or multiple layers formed of a conductive material with good conductivity. For example, each of the first touch conductive layer 711 and the second touch conductive layer 713 may include a transparent conductive layer, or a single layer or a multilayer formed of a conductive material including aluminum (Al), copper (Cu), and/or titanium (Ti). The transparent conductive layer may include a transparent conductive oxide such as indium tin oxide (ITO), indium zinc oxide (IZO), zinc oxide (ZnO), and/or indium tin zinc oxide (ITZO). In some embodiments, the transparent conductive layer may include a conductive polymer such as PEDOT, metal nanowire, graphene, and/or the like. In some embodiments, each of the first touch conductive layer 711 and the second touch conductive layer 713 may have a stack structure of Ti/Al/Ti.

Each of the first insulating layer 712 and the second insulating layer 714 may include an inorganic material or an organic material. The inorganic material may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one selected from acrylic resin, polyisoprene, vinyl-based resin, epoxy-based resin, urethane-based resin, cellulose-based resin, and perylene-based resin.

In some embodiments, a touch buffer layer may be further provided between the second substrate 310 and the touchscreen layer 700. The touch buffer layer may function to block or reduce an interference signal that may occur when driving the touchscreen layer 700. The touch buffer layer may include an inorganic material such as silicon oxide, silicon nitride, silicon oxynitride, aluminum oxide, aluminum nitride, titanium oxide, and/or titanium nitride, or an organic material such as polyimide, polyester, and/or acryl, and may be formed of any stack thereof.

Because the touch buffer layer and/or the touchscreen layer 700 are formed directly on the second substrate 310 by deposition and/or the like, a separate adhesive layer may not be required on the second substrate 310. Thus, the thickness of the display panel may be reduced.

An optical functional section 800 and a window 900 may be arranged on the touchscreen layer 700. The window 900 may be coupled to a component thereunder, for example, the optical functional section 800, through an adhesive layer such as an optical clear adhesive (OCA).

The optical functional section 800 may include an anti-reflection layer. The anti-reflection layer may reduce the reflectance of light (external light) incident from the outside through the window 900 toward the display panel. The anti-reflection layer may include a phase retarder and a polarizer. The phase retarder may be a film or a liquid crystal coating and may include a/2 (half-wave) phase retarder and/or a/4 (quarter-wave) phase retarder. The polarizer may also be a film or a liquid crystal coating. The film may include a stretched synthetic resin film, and the liquid crystal coating may include liquid crystals arranged in a certain arrangement. The phase retarder and the polarizer may each independently further include a protective film.

In other embodiments, the anti-reflection layer may include a structure of color filters and a black matrix. The color filters may be arranged in consideration of the color of light emitted from each of the pixels of the display panel. In other embodiments, the anti-reflection layer may include a destructive interference structure. The destructive interference structure may include a first reflective layer and a second reflective layer arranged on different layers. The first reflected light and the second reflected light respectively reflected by the first reflective layer and the second reflective layer may destructively interfere with each other, and accordingly the external light reflectance may be reduced.

The optical functional section 800 may include a lens layer. The lens layer may improve the light emission efficiency of light emitted from the display panel and/or may reduce color deviation. The lens layer may include a layer having a concave or convex lens shape and/or may include a plurality of layers having different refractive indexes. The optical functional section 800 may include both the anti-reflection layer and the lens layer described above or may include any one of them.

The touchscreen layer 700 and the optical functional section 800 may include a hole corresponding to the transmission area TA.

The window 900 may be arranged over the optical functional section 800 to protect the components arranged thereunder. The window 900 may include a transparent glass material, a polymer resin, and/or the like. When an adhesive layer between the window 900 and the optical functional section 800 may include an optical clear adhesive (OCA), the adhesive layer may not include a hole corresponding to the transmission area TA.

Figure 9:
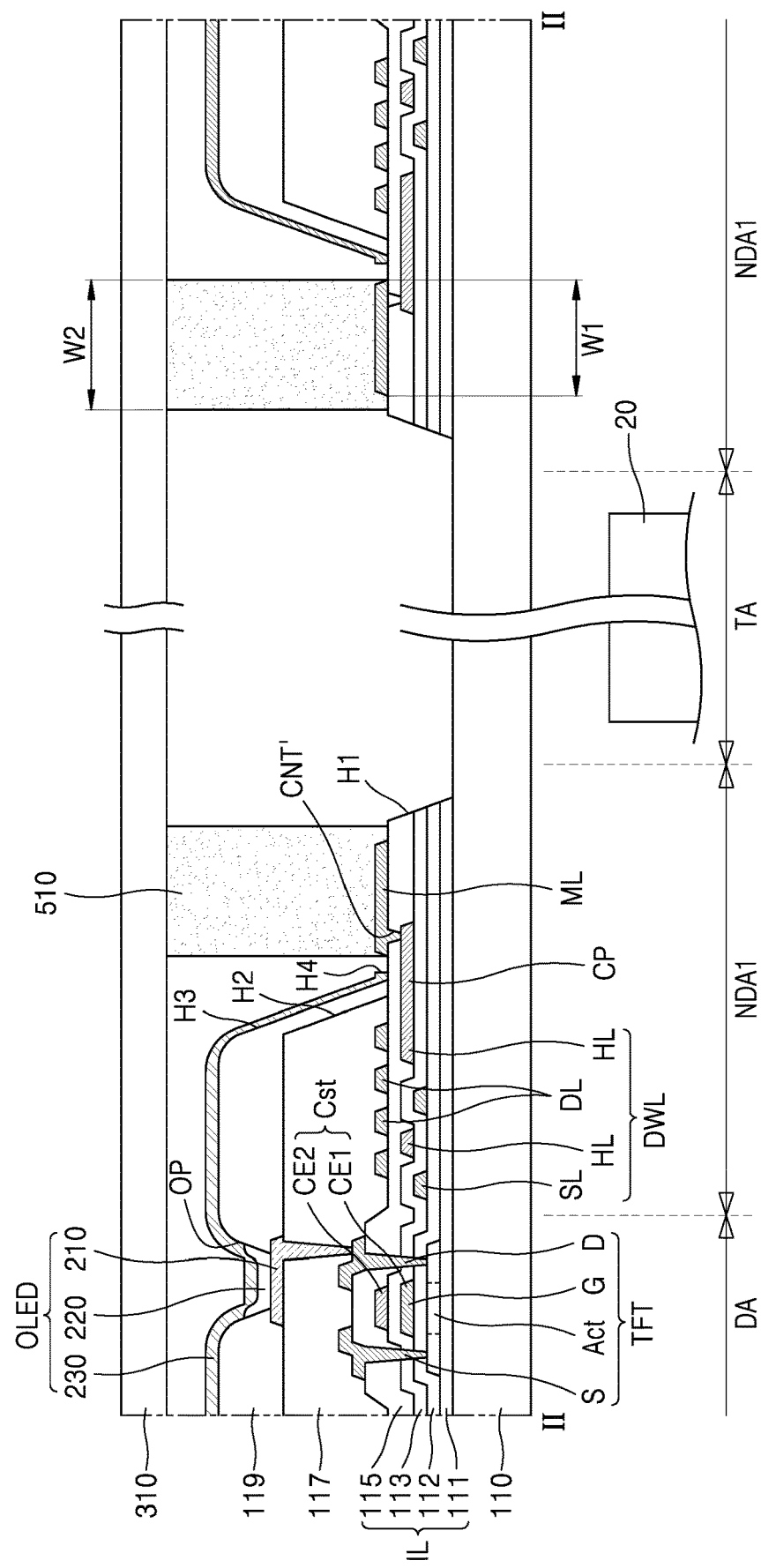
FIG. 9 is a cross-sectional view schematically illustrating a display panel according to some embodiments.

FIG. 9 is a cross-sectional view schematically illustrating a display panel according to some embodiments. In FIG. 9, like reference numerals as in FIG. 6 denote like members, and redundant descriptions thereof will not be provided for conciseness.

Referring to FIG. 9, the display panel may include: a first substrate 110 including a transmission area TA, a display area DA where display elements are arranged, and a first non-display area NDA1; a second substrate 310 arranged to face the first substrate 110; a first sealing member 510 arranged between the first substrate 110 and the second substrate 310 around the transmission area TA; and a metal layer ML arranged under the first sealing member 510. In some embodiments, the metal layer ML may be electrically connected to at least one bypass line bypassing the transmission area TA.

In the present embodiment, the first substrate 110 may be continuously arranged corresponding to the transmission area TA and may not include a through hole. In this case, an electronic element 20 may be arranged under the first substrate 110.

In some embodiments, the second substrate 310 may be continuously arranged corresponding to the transmission area TA and may not include a through hole. In this case, the first sealing member 510 may function to support the first substrate 110 and the second substrate 310.

As one of various possible modifications, only one of the first substrate 110 and the second substrate 310 may include a through hole corresponding to the transmission area TA.

As described above, according to the embodiments of the present disclosure, because the metal layer connected to the bypass line is arranged under the sealing member, the bonding of the sealing member may be enhanced and also the display panel may be protected from static electricity. However, these effects are merely examples and the scope of the present disclosure is not limited thereto.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A display panel comprising:
   a first substrate comprising a transmission area, a display area at least partially surrounding the transmission area, and a first non-display area between the transmission area and the display area;
   display elements in the display area;
   a first bypass line in the first non-display area, to detour the transmission area;
   a second substrate facing the first substrate;
   a sealing member joining the first substrate to the second substrate and surrounding a periphery of the transmission area; and
   a metal layer in the first non-display area and being more adjacent to the transmission area than the first bypass line,
   wherein the metal layer is in a different layer than the first bypass line and is electrically connected to the first bypass line.

2. The display panel of claim 1, further comprising a second bypass line in the first non-display area, to detour the transmission area,
   wherein the second bypass line is in a same layer as the metal layer.

3. The display panel of claim 2, wherein the first bypass line and the second bypass line cross each other.

4. The display panel of claim 1, wherein the first bypass line comprises a connection portion protruding toward a center of the transmission area, and
   the metal layer is connected to the connection portion through a contact hole.

5. The display panel of claim 4, wherein the connection portion is a plurality of connection portions.

6. The display panel of claim 1, wherein the first bypass line is a portion of an electrode voltage line to provide a driving voltage to the display area.

7. The display panel of claim 1, wherein the first bypass line extends from an electrode of a storage capacitor in the display area.

8. The display panel of claim 1, wherein the metal layer and the sealing member surround the transmission area in a ring shape, and
   an inner diameter of the sealing member is smaller than an inner diameter of the metal layer.

9. The display panel of claim 1, wherein the metal layer and the sealing member surround the transmission area in a ring shape, and
   an outer diameter of the sealing member is equal to an outer diameter of the metal layer.

10. The display panel of claim 1, further comprising a touchscreen layer over the second substrate,
    wherein the touchscreen layer comprises a hole corresponding to the transmission area.

11. A display panel comprising:
    a first substrate comprising a first through hole;
    display elements on the first substrate and at least partially surrounding the first through hole;
    a first bypass line bent and extending along an edge of the first through hole;
    a second substrate facing the first substrate;
    a first sealing member joining the first substrate to the second substrate and surrounding a periphery of the first through hole; and
    a metal layer under the first sealing member, to surround the first through hole,
    wherein the metal layer is in a different layer than the first bypass line and is electrically connected to the first bypass line.

12. The display panel of claim 11, further comprising a storage capacitor over the first substrate, the storage capacitor comprising a first storage capacitor plate and a second storage capacitor plate over the first storage capacitor plate,
    wherein the first bypass line is in a same layer as the second storage capacitor plate.

13. The display panel of claim 12, wherein the second storage capacitor plate is connected to a driving voltage line through a contact hole, and the metal layer is in a same layer as the driving voltage line.

14. The display panel of claim 11, further comprising a first driving voltage line and a second driving voltage line over the first substrate, the first and second driving voltage lines being spaced apart from each other with the first through hole therebetween.

15. The display panel of claim 11, wherein a width of the first sealing member is greater than a width of the metal layer.

16. The display panel of claim 11, further comprising a second sealing member joining the first substrate to the second substrate and surrounding an edge of the first substrate, wherein a width of the second sealing member is greater than a width of the first sealing member.

17. The display panel of claim 11, wherein the second substrate comprises a second through hole corresponding to the first through hole.

18. The display panel of claim 11, wherein the first bypass line comprises a connection portion protruding toward a center of a transmission area, and the metal layer is connected to the connection portion through a contact hole.

19. The display panel of claim 18, wherein the connection portion is a plurality of connection portions.

20. The display panel of claim 11, wherein the metal layer comprises a plurality of through holes.

\* \* \* \* \*